United States Patent
Nishikawa et al.

(10) Patent No.: US 8,729,778 B2
(45) Date of Patent: May 20, 2014

(54) ELECTROMECHANICAL TRANSDUCER AND ACTUATOR

(75) Inventors: Masanaga Nishikawa, Nagaokakyo (JP); Takashi Hase, Nagaokakyo (JP); Toshio Nishimura, Nagaokakyo (JP)

(73) Assignee: Murata Manufacturing Co., Ltd., Nagaokakyo-Shi, Kyoto-fu (JP)

( * ) Notice: Subject to any disclaimer, the term of this patent is extended or adjusted under 35 U.S.C. 154(b) by 0 days.

(21) Appl. No.: 13/475,057

(22) Filed: May 18, 2012

(65) Prior Publication Data

US 2012/0228997 A1 Sep. 13, 2012

Related U.S. Application Data

(63) Continuation of application No. PCT/JP2010/070093, filed on Nov. 11, 2010.

(30) Foreign Application Priority Data

Nov. 25, 2009 (JP) .................................. 2009-267153

(51) Int. Cl.
*H01L 41/08* (2006.01)

(52) U.S. Cl.
USPC .......................................... 310/366; 310/328

(58) Field of Classification Search
USPC ............... 310/328, 323.13, 323.02, 363–369, 310/332, 323.01
IPC ......... H01L 41/08,41/187, 41/09; H01I 41/083; H02N 2/025, 2/004
See application file for complete search history.

(56) References Cited

U.S. PATENT DOCUMENTS

| | | | | |
|---|---|---|---|---|
| 5,034,649 A | * | 7/1991 | Chida et al. | 310/366 |
| 5,751,091 A | * | 5/1998 | Takahashi et al. | 310/332 |
| 6,097,134 A | | 8/2000 | Kawabata et al. | |
| 6,734,607 B2 | * | 5/2004 | Nagaya et al. | 310/363 |
| 7,394,181 B2 | * | 7/2008 | Su et al. | 310/328 |

FOREIGN PATENT DOCUMENTS

| | | |
|---|---|---|
| CN | 1198037 A | 11/1998 |
| JP | 9-205781 A | 8/1997 |
| JP | 10-232337 A | 9/1998 |
| JP | 11-136964 A | 5/1999 |
| JP | 2001-298970 A | 10/2001 |
| JP | 2006-121886 A | 5/2006 |
| JP | 2006-129625 A | 5/2006 |
| JP | 2006-311794 A | 11/2006 |

OTHER PUBLICATIONS

PCT/JP2010/070093 Written Opinion dated Mar. 12, 2010.
Japanese Office Action issued for counterpart application JP 2011-543206, dispatch dated Sep. 3, 2013 (with English translation attached).

* cited by examiner

*Primary Examiner* — Thomas Dougherty
*Assistant Examiner* — Karen B Addison
(74) *Attorney, Agent, or Firm* — Dickstein Shapiro LLP (57) ABSTRACT

An electromechanical transducer that includes an elongating/contracting member and a driving member. The elongating/contracting member elongates and contracts in response to application of a voltage thereto. The elongating/contracting member has a side surface that is parallel to an elongation/contraction direction. The driving member is provided on the side surface of the elongating/contracting member. The driving member is displaced with elongation and contraction of the elongating/contracting member.

12 Claims, 6 Drawing Sheets

ELECTROMECHANICAL TRANSDUCER AND ACTUATOR

CROSS REFERENCE TO RELATED APPLICATIONS

The present application is a continuation of International application No. PCT/JP2010/070093, filed Nov. 11, 2010, which claims priority to Japanese Patent Application No. 2009-267153, filed Nov. 25, 2009, the entire contents of each of which are incorporated herein by reference.

FIELD OF THE INVENTION

The present invention relates to an electromechanical transducer and an actuator equipped with the same.

BACKGROUND OF THE INVENTION

Figure 14:
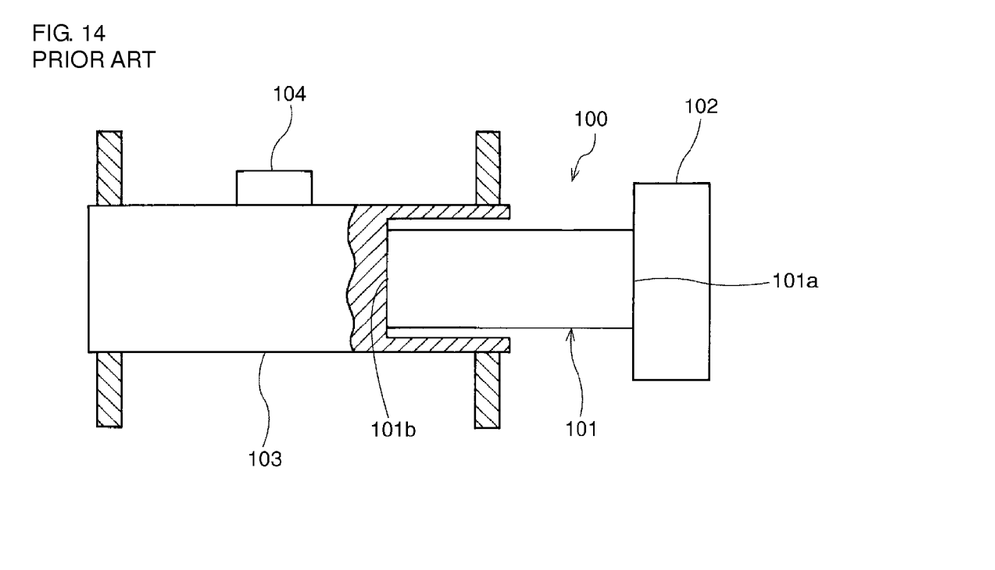
FIG. 14 is a schematic side view of a piezoelectric actuator described in Patent Literature 1.

To date, for example, a piezoelectric actuator that employs a piezoelectric element has been proposed in below-cited Patent Literature 1 as a compact actuator to be used in a camera autofocus mechanism and so forth. FIG. 14 is a schematic side view of the piezoelectric actuator described in Patent Literature 1. As illustrated in FIG. 14, a piezoelectric actuator 100 described in Patent Literature 1 includes a piezoelectric element 101. An end surface 101a of the piezoelectric element 101 on one side is connected to a fixed body 102. A drive shaft 103 is connected to an end surface 101b of the piezoelectric element 101 on the other side. A movable body 104 is provided so as to capable of sliding along the drive shaft 103.

Patent Literature 1: Japanese Unexamined Patent Application Publication No. 2006-311794

SUMMARY OF THE INVENTION

In the piezoelectric actuator 100, the drive shaft 103 is displaced by elongation and contraction of the piezoelectric element 101. At such a time, the movable body 104 is driven by the frictional force generated between the drive shaft 103 and the movable body 104. Consequently, in order to realize a high driving force, it is necessary that the energy efficiency of elongation and contraction of the piezoelectric element 101 be high. Therefore, it is preferable that the drive shaft 103 be connected to the piezoelectric element 101 in such a way that elongation and contraction of the piezoelectric element 101 is inhibited as little as possible. In the piezoelectric actuator 100, the drive shaft 103 is connected to the end surface 101b of the piezoelectric element 101, the end surface 101b being the surface that is least liable to deform during elongation and contraction of the piezoelectric element 101.

However, in the case where the drive shaft 103 is connected to the end surface 101b of the piezoelectric element 101, there is a problem in that the length of the piezoelectric actuator 100 is increased in the elongation/contraction direction.

The present invention was made in light of the above-described points and an object thereof is to provide a compact electromechanical transducer and an actuator equipped with the same.

An electromechanical transducer according to the present invention includes an elongating/contracting member and a driving member. The elongating/contracting member elongates and contracts in response to application of a voltage. The elongating/contracting member has a side surface that is parallel to an elongation/contraction direction. The driving member is provided on the side surface of the elongating/contracting member. The driving member is displaced together with elongation and contraction of the elongating/contracting member.

According to a certain specific aspect of the electromechanical transducer according to the present invention, the electromechanical transducer further includes first and second electrodes that apply a voltage to the elongating/contracting member in the elongation/contraction direction. With this configuration, the elongating/contracting member elongates and contracts due to the longitudinal piezoelectric effect. Therefore, a larger driving force and amount of displacement can be obtained.

According to another specific aspect of the electromechanical transducer according to the present invention, the portion of the elongating/contracting member on which the driving member is provided, forms an elongating/contracting portion that elongates and contracts in response to application of a voltage using the first and second electrodes. With this configuration, there is no need to actually provide a non-elongating/contracting portion to which a voltage is applied and that does not undergo elongation/contraction. Therefore, it is possible to reduce the size of the electromechanical transducer. In addition, the elongating/contracting portion can be made larger. As a result, a larger driving force can be realized.

According to yet another specific aspect of the electromechanical transducer according to the present invention, the elongating/contracting member includes an elongating/contracting portion that elongates and contracts in response to application of a voltage using the first and second electrodes, and a non-elongating/contracting portion that does not elongate and contract when a voltage is applied using the first and second electrodes, and the driving member is provided so as to straddle the elongating/contracting portion and the non-elongating/contracting portion. With this configuration, the electromechanical transducer can be reduced in size. In addition, the elongating/contracting portion can be made larger. As a result, a larger driving force can be realized.

According to yet another specific aspect of the electromechanical transducer according to the present invention, the elongating/contracting member is formed in a rectangular parallelepiped shape having first and second end surfaces that are parallel to a first direction, which is perpendicular to the elongation/contraction direction, and are parallel to a second direction, which is perpendicular to both the elongation/contraction direction and the first direction, first and second side surfaces that are parallel to the elongation/contraction direction and the first direction, and third and fourth side surfaces that are parallel to the elongation/contraction direction and the second direction. The first and second electrodes are provided inside the elongating/contracting member so as to oppose each other in the elongation/contraction direction in portions of the elongating/contracting member except for both end portions in the second direction.

According to still yet another specific aspect of the electromechanical transducer according to the present invention, the driving member is provided on at least one of the first and second side surfaces. The first electrode and the second electrode do not oppose each other at the first and second side surfaces. Consequently, the amount of deformation of the first and second side surfaces at the time of elongation or contraction of the elongating/contracting member forming the first and second side surfaces is small. Therefore, in the case where the driving member is provided on at least one of the first and second side surfaces, it is unlikely that the elongation and contraction of the elongating/contracting member will be obstructed. Therefore, it is possible to realize a high driving efficiency. In addition, with this configuration, at least one of the first and second electrodes is not exposed at the first and second side surfaces. Therefore, even in the case where the driving member possesses conductivity, there is no need to insulate the driving member and the elongating/contracting member from each other.

According to still yet another specific aspect of the electromechanical transducer according to the present invention, the driving member is provided on at least one of the third and fourth side surfaces. With this configuration, since the driving member does not necessarily have to be provided on the first and second side surfaces, there is an increased degree of freedom in designing the wiring from the first and second electrodes.

According to still yet another specific aspect of the electromechanical transducer according to the present invention, the driving member includes a first driving member that is provided on one side surface out of the first to fourth side surfaces and a second driving member that is provided on a side surface that opposes the one side surface out of the first to fourth side surfaces. In this case, a driven member can be more smoothly driven by the electromechanical transducer.

According to still yet another specific aspect of the electromechanical transducer according to the present invention, the driving member is provided on an end portion of the elongating/contracting member on one side in the elongation/contraction direction. With this configuration, a larger driving force can be realized.

According to still yet another specific aspect of the electromechanical transducer according to the present invention, an end portion of the elongating/contracting member on the other side in the elongation/contraction direction forms a fixed end portion that is connected to a fixed portion. With this configuration, a larger driving force can be realized.

According to still yet another specific aspect of the electromechanical transducer according to the present invention, the electromechanical transducer further includes a weight that is provided on an end portion of the elongating/contracting member on the other side in the elongation/contraction direction. With this configuration, a larger driving force can be realized.

In the present invention, the term "weight" refers to a member having a specific gravity equal to or greater than that of the elongating/contracting member.

According to still yet another specific aspect of the electromechanical transducer according to the present invention, the driving member is located within a range in which the elongating/contracting member is located in the elongation/contraction direction.

According to still yet another specific aspect of the electromechanical transducer according to the present invention, the elongating/contracting member is composed of a piezoelectric material.

An actuator according to the present invention, includes the electromechanical transducer according to the above-described present invention, and a driven member. The driven member is in contact with the driving member and is displaced relative to the electromechanical transducer due to a frictional force generated between the driven member and the driving member when the elongating/contracting member elongates and contracts.

In the present invention, a driving member that is displaced together with elongation and contraction of an elongating/contracting member is provided on a side surface of the elongating/contracting member. As a result, the lengthwise dimension of the electromechanical transducer in the elongation/contraction direction can be reduced. Furthermore, different from the case where a driving member is provided on an end surface of an elongating/contracting member, in the present invention, the degree of formation precision such as surface roughness and cleanliness demanded at the end surface of the elongating/contracting member is reduced.

DETAILED DESCRIPTION OF THE PREFERRED EMBODIMENTS

Hereafter, an example of a preferred mode of carrying out the present invention will be described. However, the below embodiment is simply an illustrative example. The present invention is not limited to the below embodiment.

(First Embodiment)

Figure 1:
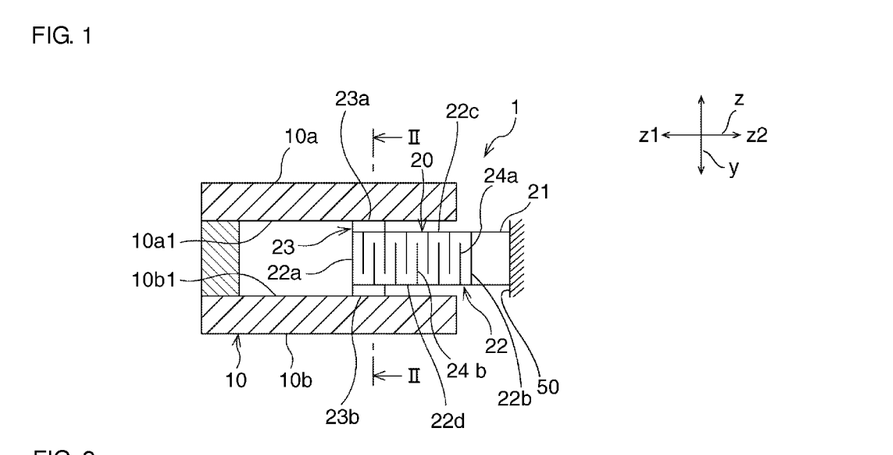
FIG. 1 is a schematic sectional view of a piezoelectric actuator according to a first embodiment.
Figure 2:
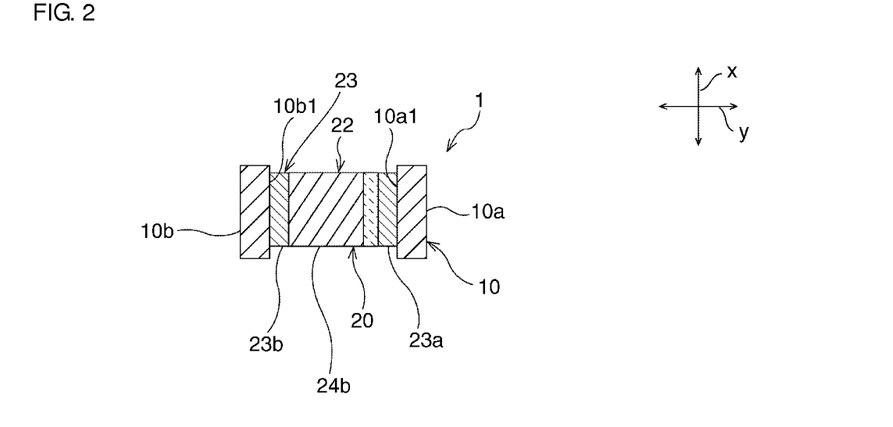
FIG. 2 is a schematic sectional view taken along line II-II of FIG. 1.

FIG. 1 is a schematic sectional view of a piezoelectric actuator according to a first embodiment. FIG. 2 is a schematic sectional view taken along line II-II of FIG. 1.

As illustrated in FIG. 1, a piezoelectric actuator 1 includes an electromechanical transducer 20 and a driven member 10. The driven member 10 is a member that is driven by the electromechanical transducer 20.

In the present invention, generally, displacement of one of the driven member and the electromechanical transducer is restrained, while the other undergoes displacement. Either displacement of the driven member or displacement of the electromechanical transducer may be restrained. For example, the displacement of the driven member may be restrained or the displacement of the electromechanical transducer may be restrained. In the present embodiment, an example will be described in which the electromechanical transducer 20 is fixed in place and the driven member 10 is displaced.

Furthermore, the method by which displacement of the driven member or the electromechanical transducer is restrained is not particularly limited. For example, the displacement of the driven member or the electromechanical transducer may be restrained by attaching a weight to the driven member or the electromechanical transducer. Furthermore, for example, displacement of the driven member or the electromechanical transducer may be restrained by connecting the driven member or the electromechanical transducer to a fixed member. In the present embodiment, displacement of the electromechanical transducer 20 is restrained by connecting an end surface 22b of the electromechanical transducer 20 on one side in a displacement direction z to a fixed portion 50 via a weight 21.

The fixed portion 50, for example, is formed of a device casing in which the piezoelectric actuator 1 is mounted or of a member that is fixed to the casing.

The weight 21 is not a member that is particularly essential to the present invention, but the driven member 10 can be made to be more efficiently displaced by providing the weight 21. So long as the weight 21, for example, has a specific gravity equal to or greater than that of the elongating/contracting member 22, which will be described below, the weight 21 is not particularly limited. The weight 21, for example, can be formed of a metal, an alloy or a ceramic.

Figure 3:
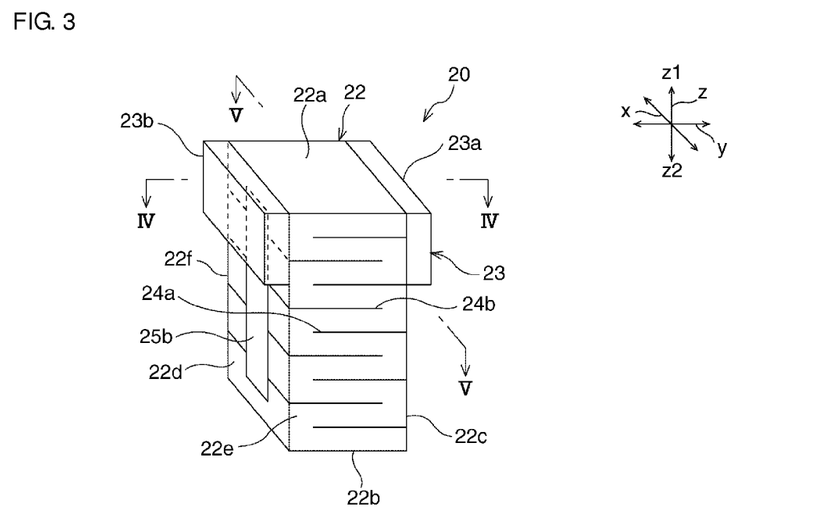
FIG. 3 is a schematic perspective view of an electromechanical transducer of the first embodiment.
Figure 4:
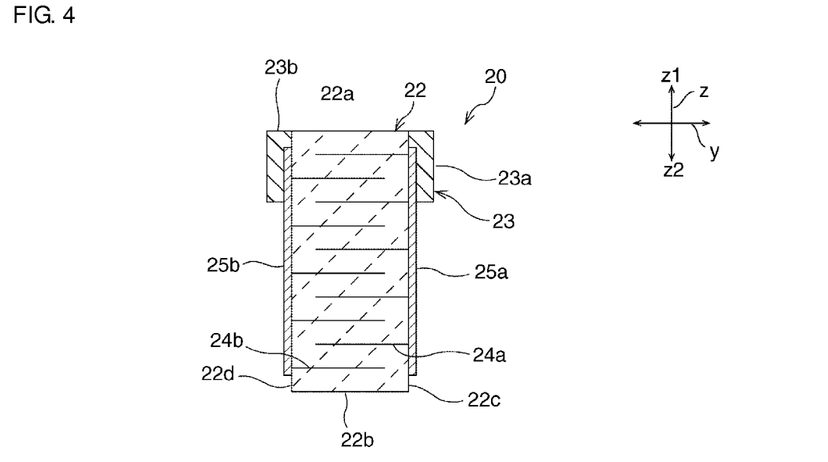
FIG. 4 is a schematic sectional view taken along line IV-IV of FIG. 3.
Figure 5:
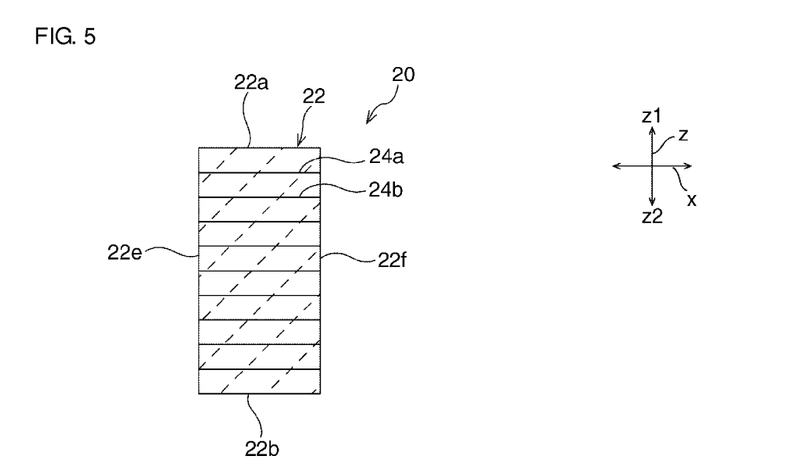
FIG. 5 is a schematic sectional view taken along line V-V of FIG. 3.

FIG. 3 is a schematic perspective view of the electromechanical transducer of the first embodiment. FIG. 4 is a schematic sectional view taken along line IV-IV of FIG. 3. FIG. 5 is a schematic sectional view taken along line V-V of FIG. 3.

Next, the electromechanical transducer 20 will be described in detail while mainly referring to FIGS. 3 to 5.

As illustrated in FIGS. 3 to 5, the electromechanical transducer 20 includes the elongating/contracting member 22 and first and second inner electrodes 24a and 24b. The elongating/contracting member 22 is a member that elongates and contracts along a third direction z in response to application of a voltage in the third direction z by the first and second inner electrodes 24a and 24b. That is, the elongating/contracting member 22 is a member that elongates and contracts due to the longitudinal piezoelectric effect (d33 mode).

In this embodiment, specifically, the elongating/contracting member 22 is formed of a piezoelectric material. An example of a piezoelectric material is a piezoelectric ceramic. A specific example of a piezoelectric ceramic is a PZT (lead zirconate titanate)-based ceramic.

The elongating/contracting member 22 is formed in a square column shape. Here, the term "square column" includes square columns obtained by forming at least some of corner and edge portions into chamfered or R chamfered shapes. That is, the term "square column" refers to a three-dimensional body that has a pair of end surfaces, first and second side surfaces that are perpendicular to the pair of end surfaces, and third and fourth side surfaces that are perpendicular to both the first and second end surfaces and the first and second side surfaces.

The elongating/contracting member 22 has first and second end surfaces 22a and 22b and first to fourth side surfaces 22c to 22f. The first and second end surfaces 22a and 22b each extend in a first direction x, which is perpendicular to the third direction z (elongation/contraction direction) and in a second direction y, which is perpendicular to both the third direction z and the first direction x. The first and second side surfaces 22c and 22d each extend in the third direction z and the first direction x. The third and fourth side surfaces 22e and 22f each extend in the third direction z and the second direction y.

The first and second inner electrodes 24a and 24b are provided inside the elongating/contracting member 22. The first and second inner electrodes 24a and 24b are for applying a voltage in the third direction z to the elongating/contracting member 22. Specifically, in this embodiment, a plurality of first inner electrodes 24a and a plurality of second inner electrodes 24b are alternately arranged in the third direction z inside the elongating/contracting member 22. Each of the first and second inner electrodes 24a and 24b is parallel to the first direction x and the second direction y. The first inner electrodes 24a are exposed at the first, third and fourth side surfaces 22c, 22e and 22f, but are not exposed at the second side surface 22d. On the other hand, the second inner electrodes 24b are exposed at the second to fourth side surfaces 22d to 22f, but are not exposed at the first side surface 22c. Consequently, the first and second inner electrodes 24a and 24b oppose one another in the third direction z, in portions of the elongating/contracting member 22 except the two end portions in the second direction y. The first and second inner electrodes 24a and 24b do not oppose one another in the third direction z in the two end portions of the elongating/contracting member 22 in the second direction y. That is, the first and second inner electrodes 24a and 24b do not oppose each other in the third direction z at the first and second side surfaces 22c and 22d.

In this embodiment, a voltage is applied using the first and second inner electrodes 24a and 24b to substantially the entirety of the elongating/contracting member 22 in the third direction z. Consequently, substantially the entirety of the elongating/contracting member 22 forms an elongating/contracting portion.

As illustrated in FIG. 4, a first outer electrode 25a is provided on the first side surface 22c. The first outer electrode 25a is connected to the first inner electrodes 24a. A voltage is applied to the first inner electrodes 24a through the first outer electrode 25a.

On the other hand, as illustrated in FIG. 3 and FIG. 4, a second outer electrode 25b is provided on the second side surface 22d. The second outer electrode 25b is connected to the second inner electrodes 24b. A voltage is applied to the second inner electrodes 24b through the second outer electrode 25b. For ease of illustration, illustration of the first and second outer electrodes 25a and 25b has been omitted from FIGS. 1 and 2 and from FIGS. 7, 12 and 13 to be described below.

So long as the first and second outer electrodes 25a and 25b are connected to the first and second inner electrodes 24a and 24b, the shapes of the first and second outer electrodes 25a and 25b are not particularly limited. The first and second outer electrodes 25a and 25b, for example, may be provided over part of or over the entirety of the first and second side surfaces 22c and 22d.

So long as a conductive material is used, the material used for forming the first and second inner electrodes 24a and 24b and the first and second outer electrodes 25a and 25b is not particularly limited. The first and second inner electrodes 24a and 24b and the first and second outer electrodes 25a and 25b, for example, are formed of a metal such as Ag, Cu, Pt, Au, Ni, Cr or Pd, or an alloy having at least one of these metals as a main component. Specific examples of such an alloy include a AgPd alloy and a NiCr alloy. Furthermore, the first and second inner electrodes 24a and 24b and the first and second outer electrodes 25a and 25b may be formed of laminae of a plurality of conductive films. For example, the first and second inner electrodes 24a and 24b and the first and second outer electrodes 25a and 25b may be formed of laminae of a Ag layer and a NiCr layer.

The method used to form the first and second inner electrodes 24a and 24b and the first and second outer electrodes 25a and 25b is not particularly limited. The first and second inner electrodes 24a and 24b, for example, may be formed by applying a conductive paste onto ceramic green sheets and then performing firing. The first and second outer electrodes 25a and 25b, for example, may be formed using a conductive paste and may be formed using a thin film forming method such as a sputtering method or a vapor deposition method. In addition, the first and second outer electrodes 25a and 25b, for example, may be formed by performing plating.

As illustrated in FIGS. 1 to 4, the piezoelectric actuator 1 includes a driving member 23 that is displaced by elongation and contraction of the elongating/contracting member 22. The driving member 23, as will be described in detail below, is member for causing the driven member 10 to be driven by providing the driven member 10 with a frictional force. Accordingly, the driving member 23 can also be referred to as a frictional member.

The driving member 23 is provided on a side surface of the elongating/contracting portion, which is parallel to the third direction z, which is the elongation/contraction direction. More specifically, in this embodiment, the driving member 23 includes a first driving member 23a and a second driving member 23b. The first driving member 23a is connected to the first side surface 22c. The second driving member 23b is connected to the second side surface 22d, which opposes the first side surface 22c.

The first and second driving members 23a and 23b are provided on a z1-side end portion of the elongating/contracting member 22, which is on a side opposite to a z2-side end portion of the elongating/contracting member 22 that is connected to the fixed portion 50 via the weight 21. More specifically, the first and second driving members 23a and 23b are provided such that the z1-side edges thereof in the third direction z and the first end surface 22a are located at the same position in the third direction z. That is, the z1-side edges of the first and second driving members 23a and 23b are provided so as to be located at the z1-side edge of the elongating/contracting member 22. Consequently, the first and second driving members 23a and 23b are located in a region within which the elongating/contracting member 22 is located in the third direction z, which is the elongation/contraction direction.

As mainly illustrated in FIG. 3, in this embodiment, each of the first and second driving members 23a and 23b is formed in a rectangular parallelepiped shape. However, in the present invention, the shape of the driving member is not particularly limited. The driving member may be formed in a shape other than a rectangular parallelepiped shape.

Furthermore, in this embodiment, the first and second driving members 23a and 23b are formed so as to extend from one edge to the other edge of the first and second side surfaces 22c and 22d in the first direction x. However, the present invention is not limited to this configuration. In the present invention, the driving member may be provided on just part of a side surface of the elongating/contracting member in a direction perpendicular to the elongation/contraction direction. However, from the viewpoint of generating a large frictional force between the driving member and the driven member, it is preferable that the driving member be formed so as to extend from one edge to the other edge of a side surface of the elongating/contracting member in a direction perpendicular to the elongation/contraction direction.

So long as the material of the driving member 23 is one with which a frictional force can be generated between the driving member 23 and the driven member 10, the material of the driving member 23 is not particularly limited. The driving member 23, for example, can be formed of carbon, a metal, or an alloy such as carbide. Among these materials, it is more preferable that the driving member 23 be formed of carbon, which is lightweight and comparatively soft. Among types of carbon, it is further preferable that the driving member 23 be formed of carbon fiber. This is because as well as carbon fiber being lightweight, carbon fiber has a high modulus of elasticity, an excellent coefficient of friction, and is hard wearing.

In addition, the method through which the driving member 23 is connected to the elongating/contracting member 22 is not particularly limited. Typically, the driving member 23 can be connected to the elongating/contracting member 22 using an adhesive. An epoxy-based adhesive is one of the specific examples of an adhesive. In addition, the adhesive used for connecting the driving member 23 to the elongating/contracting member 22 may be for example an energy curable resin. The term "energy curable resin" means a resin that is cured by being irradiated with energy rays such as heat rays or light rays. Examples of energy curable resins include heat curable resins and light curable resins.

Next, the driven member 10 will be described while referring to FIG. 1 and FIG. 2. The driven member 10 is a member that is in contact with the driving member 23 and is displaced relative to the electromechanical transducer 20 by a frictional force generated between itself and the driving member 23 when the elongating/contracting member 22 elongates and contracts, for at least part of a period during which the electromechanical transducer 20 is elongating and contracting.

In this embodiment, the driven member 10 includes first and second side wall portions 10a and 10b, which are connected to each other. The first and second side wall portions 10a and 10b are arranged so as to oppose each other with the electromechanical transducer 20 interposed therebetween in the second direction y. The first and second side wall portions 10a and 10b include wall surfaces 10a1 and 10b1, which are in contact with the driving member 23.

So long as the material of the driven member 10 is one with which a frictional force can be generated between the driving member 23 and the driven member 10, the material of the driven member 10 is not particularly limited. The driven member 10 for example can be formed of carbon or a metal.

Figure 6:
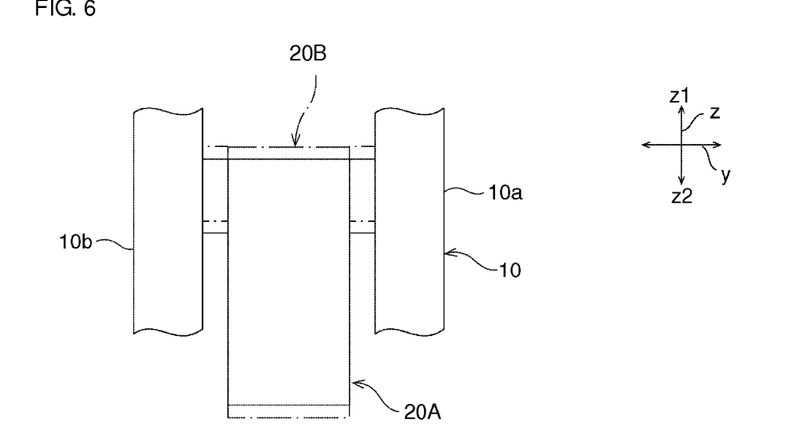
FIG. 6 is a schematic view for explaining states of elongation and contraction of the electromechanical transducer of the first embodiment.

FIG. 6 is a schematic view for explaining states of elongation and contraction of the electromechanical transducer of this embodiment. Next, the operation of the electromechanical transducer 20 will be described while mainly referring to FIG. 6.

As described above, the elongating/contracting member 22 is a member that elongates and contracts due to the longitudinal piezoelectric effect. Accordingly, when a voltage is applied to the electromechanical transducer 20, the electromechanical transducer 20, as illustrated in FIG. 6, elongates and contracts in the third direction z, which is an elongation/contraction direction. Specifically, in FIG. 6, an electromechanical transducer 20A indicated by a solid line illustrates the electromechanical transducer 20 in a state where a voltage is not being applied. When a voltage is applied to the electromechanical transducer 20, the electromechanical transducer 20 elongates in the third direction z and becomes an electromechanical transducer 20B in an elongated state illustrated by a single dot dashed line.

In this embodiment, when the electromechanical transducer 20 elongates and contracts in the above-described states, a frictional force is generated between the driving member 23 and the driven member 10. The driven member 10 is displaced relative to the electromechanical transducer 20 by this frictional force.

The waveform of the voltage applied between the first and second inner electrodes 24a and 24b is not particularly limited. For example, a voltage having a rectangular waveform or a sawtooth waveform may be applied between the first and second inner electrodes 24a and 24b.

As has been described above, in this embodiment, the driving member 23 is provided on the side surfaces 22c and 22d of the elongating/contracting member 22. Therefore, for example, it is possible to make the length dimension of the electromechanical transducer 20 in the third direction z be smaller than that in the case where the driving member is provided on an end surface of the elongating/contracting member on the side opposite to that of the end surface on the fixed side.

In addition, for example, in the case where the driving member 23 is provided on a side surface of the elongating/contracting member 22 as in this embodiment, durability to impacts such as an impact due to being dropped can be improved over that in the case where the driving member is provided on an end surface of the elongating/contracting member.

In addition, in this embodiment, the elongating/contracting member 22 is a member that elongates and contracts due to the longitudinal piezoelectric effect. Accordingly, for example, compared with the case where the elongating/contracting member is a member that elongates and contracts in a d31 mode, a greater driving force can be obtained. In addition, in this embodiment, a plurality of first inner electrodes 24a and a plurality of second inner electrodes 24b are alternately arranged in the third direction z. That is, the electromechanical transducer 20 is multilayer device. Therefore, a greater driving force can be obtained.

In addition, in this embodiment, the driving member 23 is provided on an end portion of the elongating/contracting member 22 on the side opposite to the end portion on the fixed side. Consequently, for example, compared with the case in which the driving member 23 is provided in a central portion or the like of the elongating/contracting member 22 in the third direction z, the amount of displacement of the driving member 23 at the time of elongation/contraction of the elongating/contracting member 22 can be made larger. Therefore, the piezoelectric actuator 1 having a higher output can be realized.

In addition, in this embodiment, substantially the entirety of the elongating/contracting member 22 serves as elongating/contracting portion that deforms. Consequently, for example, the amount of deformation of the elongating/contracting member 22 can be made larger than that in the case where part of the elongating/contracting member serves as a non-elongating/contracting portion and the remainder serves as an elongating/contracting portion. Therefore, the piezoelectric actuator 1 having a higher output can be realized.

When the elongating/contracting member 22 elongates and contracts, the amount of deformation of the side surfaces of the elongating/contracting member 22 is larger than that of the end surfaces of the elongating/contracting member 22. Consequently, there is a risk of the elongating and contracting of the elongating/contracting member 22 being obstructed by the driving member 23 if the driving member 23 is attached to side surfaces of the elongating/contracting member 22. In view of this, in this embodiment, the first and second driving members 23a and 23b are connected to the first and second side surfaces 22c and 22d. The first and second inner electrodes 24a and 24b do not oppose each other in the third direction z at the first and second side surfaces 22c and 22d and therefore the amount of deformation at the first and second side surfaces 22c and 22d when the elongating/contracting member 22 elongates and contracts is small. Therefore, as a result of the first and second driving members 23a and 23b being connected to the first and second side surfaces 22c and 22d, obstructing of the elongating and contracting of the elongating/contracting member 22 by the driving member 23 is effectively suppressed. As a result, high driving efficiency can be realized for the piezoelectric actuator 1.

In addition, in the case where the driving member 23 is provided on the first and second side surfaces 22c and 22d at which either of the first and second inner electrodes 24a and 24b is exposed, it is a simple matter to adopt a conductive member having conductivity as the driving member 23. This is because there is no need to insulate the driving member 23 and the elongating/contracting member 22 from each other in the case where the driving member 23 having conductivity is adopted.

In the present invention, in the case where a plurality of driving members are provided, there is no particular restriction on which of the first to fourth side surfaces a driving member is to be provided on. However, for example, as in the present embodiment, in the case where two or more driving members 23a and 23b are provided, it is preferable that the driving members be provided on a pair of side surfaces that oppose each other among the first to fourth side surfaces 22c to 22f. By doing this, the driven member 10 can be more smoothly driven by the electromechanical transducer 20.

Hereafter, description of other examples of preferable modes of carrying out the present invention and modifications will be given. In the following description, members having substantially the same functions as those of the first embodiment will be referred to using the same symbols and description thereof will be omitted.

(Second Embodiment)

Figure 7:
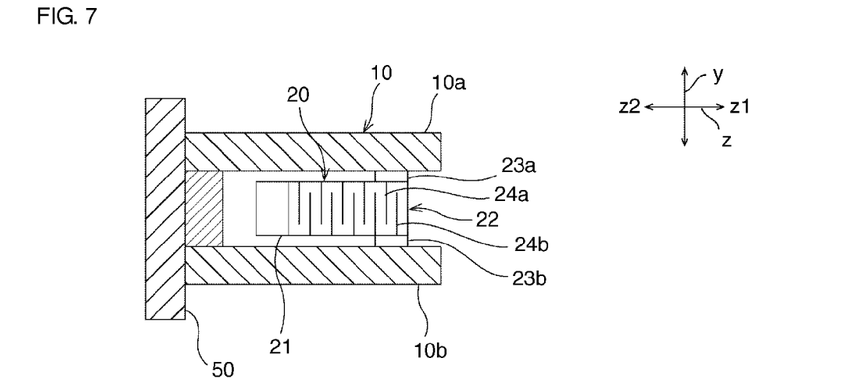
FIG. 7 is a schematic sectional view of a piezoelectric actuator according to a second embodiment.

FIG. 7 is a schematic sectional view of a piezoelectric actuator according to a second embodiment.

In the first embodiment, an example was described in which the electromechanical transducer 20 is fixed in place to the fixed portion 50 and the driven member 10 is displaced. However, the present invention is not limited to this configuration. For example, as illustrated in FIG. 7, a configuration may be adopted in which the driven member 10 is fixed to the fixed portion 50 and the electromechanical transducer 20 is displaced.

(Third to Fifth Embodiments)

Figure 8:
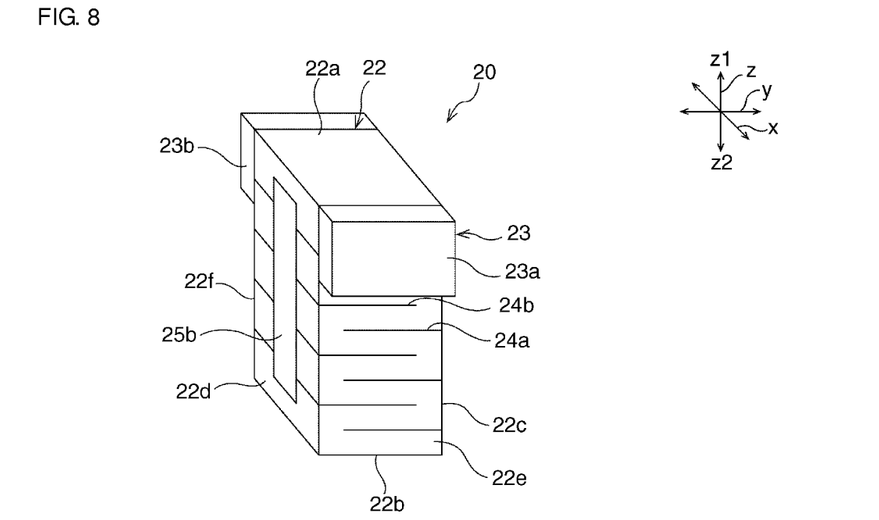
FIG. 8 is a schematic perspective view of an electromechanical transducer of a third embodiment.
Figure 9:
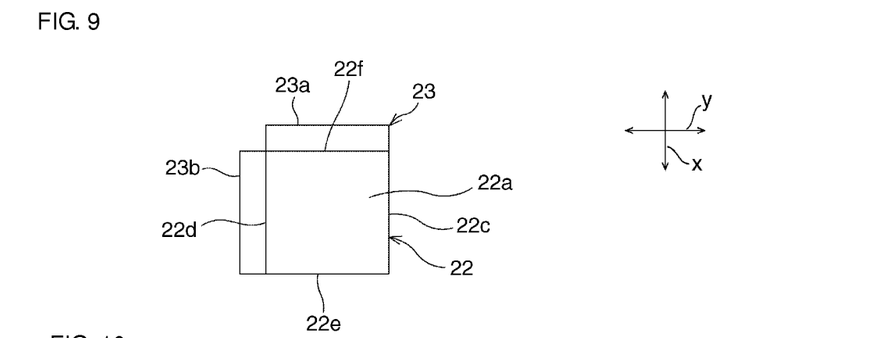
FIG. 9 is a schematic sectional view of an electromechanical transducer of a fourth embodiment.
Figure 10:
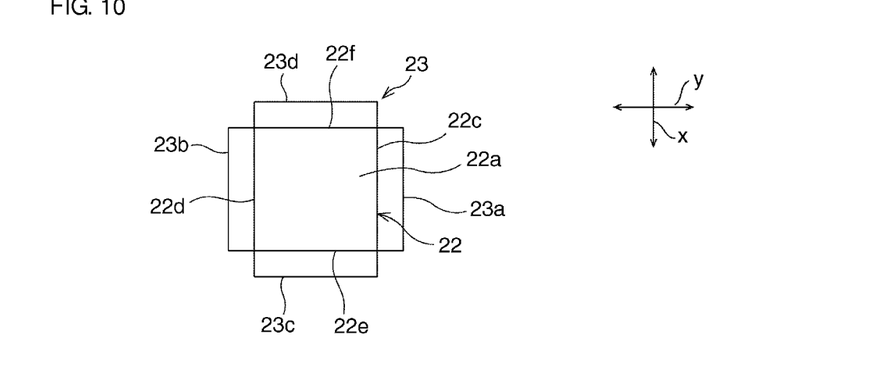
FIG. 10 is a schematic plan view of an electromechanical transducer of a fifth embodiment.

FIG. 8 is a schematic perspective view of an electromechanical transducer of a third embodiment. FIG. 9 is a schematic sectional view of an electromechanical transducer of a fourth embodiment. FIG. 10 is a schematic plan view of an electromechanical transducer of a fifth embodiment.

In the first embodiment, an example was described in which the driving member 23 is provided on at least one of the first and second side surfaces 22c and 22d of the elongating/contracting member 22. However, the present invention is not limited to this configuration. A driving member, for example, may be provided on at least one of the third and fourth side surfaces 22e and 22f of the elongating/contracting member.

For example, in the example illustrated in FIG. 8, the first and second driving members 23a and 23b are provided on the third and fourth side surfaces 22e and 22f. In this case, since driving members are not provided on the first and second side surfaces 22c and 22d, which are surfaces on which outer electrodes are formed, it is possible to provide a greater degree of freedom in designing the wiring to the first and second outer electrodes 25a and 25b.

Furthermore, for example, in the example illustrated in FIG. 9, the first and second driving members 23a and 23b are provided on the second side surface 22d and the fourth side surface 22f. In this case, for example, it is possible to arrange the elongating/contracting member 22 in a corner portion of a casing. Therefore, it is possible to reduce the size of a casing.

In the first and second embodiments (FIG. 1 and FIG. 7), a frictional force is provided in the y direction and displacement occurs in the z direction. At this time, it is necessary for a guide to be provided so that displacement does not occur in the x direction and a two-direction support structure is necessary. In the fourth embodiment illustrated in FIG. 9, a frictional force can be provided in both the x and y directions by applying a stress at an angle of 45 degrees and as a result the support structure is simplified. For example, in the case where the electromechanical transducer of this embodiment is applied to driving an autofocus lens of a camera module, since a circular lens is arranged in a rectangular casing, it is desirable that the corner portions (corners) of the casing be effectively utilized in order to facilitate size reduction. In the example of FIG. 9, it is possible to arrange the elongating/contracting member in a corner (corner portion) of the casing and therefore it is possible to reduce the size of the casing.

Furthermore, for example, in the example illustrated in FIG. 10, first to fourth driving members 23a to 23d are provided on the first to fourth side surfaces 22c to 22f. In the example illustrated in FIG. 10, the first to fourth driving members 23a to 23d are respectively provided as separate bodies. However, the first to fourth driving members 23a to 23d may be provided as a single body.

(Sixth Embodiment)

Figure 11:
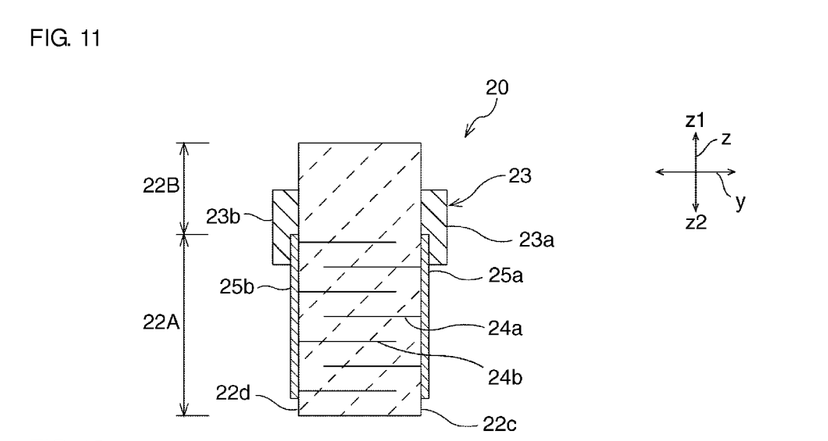
FIG. 11 is a schematic plan view of an electromechanical transducer of a sixth embodiment.

FIG. 11 is a schematic plan view of an electromechanical transducer of a sixth embodiment.

In the first embodiment, an example was described in which substantially the entirety of the elongating/contracting member 22 served as an elongating/contracting portion and in which the driving member 23 is connected to this elongating/contracting portion. However, the present invention is not limited to this configuration.

For example, in the example illustrated in FIG. 11, in the elongating/contracting member 22, there are provided an elongating/contracting portion 22A, in which the first and second inner electrodes 24a and 24b are provided and which elongates and contracts in response to application of a voltage by the first and second inner electrodes 24a and 24b, and a non-elongating/contracting portion 22B, in which the first and second inner electrodes 24a and 24b are not provided and which does not elongate and contract when a voltage is applied by the first and second inner electrodes 24a and 24b. Then, the driving member 23 is provided so as to straddle the elongating/contracting portion 22A and the non-elongating portion 22B. With this configuration, for example, the actuator can be reduced in size compared with the case where the driving member 23 is provided only on the non-elongating/contracting portion 22B.

(Seventh Embodiment)

Figure 12:
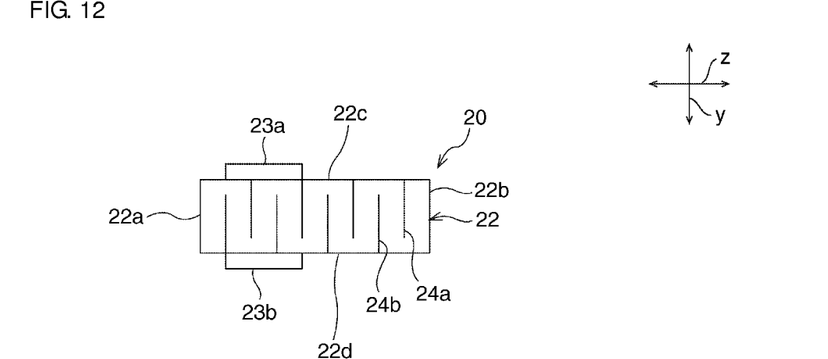
FIG. 12 is a schematic side view of an electromechanical transducer of a seventh embodiment.

FIG. 12 is a schematic side view of an electromechanical transducer of a seventh embodiment.

In the first embodiment, an example was described in which the first and second driving members 23a and 23b are formed so as to reach the first end surface 22a in the third direction z. However, the present invention is not limited to this configuration.

For example, as illustrated in FIG. 12, the first and second driving members 23a and 23b may be formed so as to be spaced apart from the first end surface 22a in the third direction z.

(Eighth Embodiment)

Figure 13:
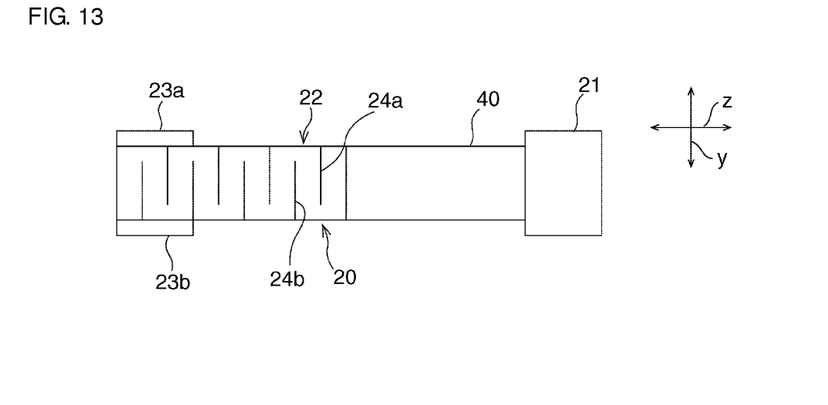
FIG. 13 is a schematic side view of an electromechanical transducer of an eighth embodiment.

FIG. 13 is a schematic side view of an electromechanical transducer of an eighth embodiment.

In the first embodiment, an example was described in which the elongating/contracting member 22 is connected to the weight 21 and furthermore the weight 21 is connected to the fixed portion 50. However, the present invention is not limited to this configuration.

For example, as illustrated in FIG. 13, the elongating/contracting member 22 may be connected to the weight 21 via a rod-shaped member 40. By adopting this configuration, the distance between the center of gravity of the electromechanical transducer 20 and the driving members 23a and 23b in the third direction z can be made larger. Therefore, a greater driving force can be obtained.

In addition, for example, the elongating/contracting member 22 may be directly connected to the fixed portion without providing the weight 21.

Furthermore, for example, the weight 21 need not be connected to the fixed portion 50.

(Other Modifications)

In the first embodiment, a case was described in which the elongating/contracting member 22 is composed of a piezoelectric material. However, so long as the elongating/contracting member 22 is a member that elongates and contracts in response to application of a voltage, the elongating/contracting member 22 is not limited to being a member that is composed of a piezoelectric material.

REFERENCE SIGNS LIST

1 . . . piezoelectric actuator
10 . . . driven member
10a . . . first side wall portion
10b . . . second side wall portion
20 . . . electromechanical transducer
20A . . . electromechanical transducer in contracted state
20B . . . electromechanical transducer in elongated state
21 . . . weight
22 . . . elongating/contracting member
22A . . . elongating/contracting portion of elongating/contracting member
22B . . . non-elongating/contracting portion of elongating/contracting member
22a . . . first end surface
22b . . . second end surface
22c . . . first side surface
22d . . . second side surface
22e . . . third side surface
22f . . . fourth side surface
23 . . . driving member
23a . . . first driving member
23b . . . second driving member
23c . . . third driving member
23d . . . fourth driving member
24a . . . first inner electrode
24b . . . second inner electrode
25a . . . first outer electrode
25b . . . second outer electrode
40 . . . rod-shaped member
50 . . . fixed portion

The invention claimed is:

1. An electromechanical transducer comprising:
  an elongating/contracting member that elongates and contracts in response to application of a voltage and that has a side surface that is parallel to an elongation/contraction direction;
  a driving member adjacent the side surface of the elongating/contracting member, the driving member configured to be displaced together with the elongation and contraction of the elongating/contracting member; and
  first and second electrodes disposed in portions of the elongating/contracting member that oppose each other in the elongation/contraction direction, the first and second electrodes configured to apply a voltage to the elongating/contracting member in the elongation/contraction direction, wherein the elongating/contracting member has a rectangular parallelepiped shape having:
- first and second end surfaces that are parallel to a first direction, the first direction being perpendicular to the elongation/contraction direction, and the first and second end surfaces are parallel to a second direction, the second direction being perpendicular to both the elongation/contraction direction and the first direction,
- first and second side surfaces that are parallel to the elongation/contraction direction and the first direction, and
- third and fourth side surfaces that are parallel to the elongation/contraction direction and the second direction.

2. The electromechanical transducer according to claim 1, wherein a portion of the side surface of the elongating/contracting member adjacent to the driving member is an elongating/contracting portion that elongates and contracts in response to application of the voltage via the first and second electrodes.

3. The electromechanical transducer according to claim 1, wherein the elongating/contracting member includes an elongating/contracting portion that elongates and contracts in response to the application of the voltage via the first and second electrodes, and a non-elongating/contracting portion that does not elongate and contract when the voltage is applied via the first and second electrodes, and
wherein the driving member is arranged so as to straddle the elongating/contracting portion and the non-elongating/contracting portion.

4. The electromechanical transducer according to claim 1, wherein the driving member is adjacent at least one of first and second side surfaces.

5. The electromechanical transducer according to claim 1, wherein the driving member is adjacent at least one of the third and fourth side surfaces.

6. The electromechanical transducer according to claim 1, wherein the driving member includes a first driving member adjacent a first side among the first to fourth side surfaces and a second driving member adjacent a second side among the first to fourth side surfaces that faces the first side.

7. The electromechanical transducer according to claim 1, wherein the driving member is adjacent a first end portion of the elongating/contracting member.

8. The electromechanical transducer according to claim 7, wherein a second end portion of the elongating/contracting member opposite the first end portion in the elongation/contraction direction is configured to be a fixed end portion for connection to a fixed portion.

9. The electromechanical transducer according to claim 7, further comprising a weight adjacent a second end portion of the elongating/contracting member opposite the first end portion.

10. The electromechanical transducer according to claim 1, wherein an edge of the driving member is aligned with an end surface of the elongating/contracting member.

11. The electromechanical transducer according to claim 1, wherein the elongating/contracting member is composed of a piezoelectric material.

12. An actuator comprising
the electromechanical transducer according to claim 1; and
a driven member in contact with the driving member and configured to be displaced relative to the electromechanical transducer by a frictional force generated between the driven member and the driving member when the elongating/contracting member elongates and contracts.

* * * * *